(12) United States Patent
Long et al.

(10) Patent No.: US 7,322,854 B2
(45) Date of Patent: Jan. 29, 2008

(54) SPRING-BIASED EMI SHROUD

(75) Inventors: Jerry A. Long, Elgin, IL (US); Kent E. Regnier, Lombard, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/633,911

(22) Filed: Dec. 4, 2006

(65) Prior Publication Data

US 2007/0128936 A1    Jun. 7, 2007

Related U.S. Application Data

(60) Provisional application No. 60/742,936, filed on Dec. 6, 2005.

(51) Int. Cl.
*H01R 13/648* (2006.01)

(52) U.S. Cl. ........................................ 439/607; 439/939

(58) Field of Classification Search ................ 439/607, 439/939
See application file for complete search history.

(56) References Cited

U.S. PATENT DOCUMENTS

| 5,204,496 | A | 4/1993 | Boulay et al. | |
|---|---|---|---|---|
| 5,959,244 | A | 9/1999 | Mayer | |
| 6,066,001 | A | 5/2000 | Liptak et al. | |
| 6,238,241 | B1 * | 5/2001 | Zhu et al. ................ | 439/541.5 |
| 6,269,008 | B1 | 7/2001 | Hsu | |
| 6,276,963 | B1 * | 8/2001 | Avery et al. ............. | 439/541.5 |
| 6,278,617 | B1 | 8/2001 | Yang et al. | |
| 6,359,768 | B1 | 3/2002 | Eversley et al. | |
| 6,420,009 | B1 | 7/2002 | Cheng | |
| 6,478,622 | B1 * | 11/2002 | Hwang ....................... | 439/607 |
| 6,724,641 | B1 * | 4/2004 | Hwang ....................... | 361/818 |
| 6,752,663 | B2 | 6/2004 | Bright et al. | |
| 6,822,879 | B2 * | 11/2004 | Rathnam et al. ............ | 361/818 |
| 6,851,978 | B2 | 2/2005 | Akama et al. | |
| 6,878,872 | B2 * | 4/2005 | Lloyd et al. ................ | 174/384 |
| 6,972,968 | B2 * | 12/2005 | Hwang ....................... | 361/818 |
| 7,037,136 | B1 * | 5/2006 | Korsunsky et al. ......... | 439/607 |
| 7,168,971 | B2 * | 1/2007 | Manson et al. ............. | 439/271 |
| 2004/0027818 | A1 | 2/2004 | Rathnam et al. | |

FOREIGN PATENT DOCUMENTS

WO    WO 98/02940 A1    1/1998

OTHER PUBLICATIONS

International Search Report for PCT/US2006/046275.

* cited by examiner

*Primary Examiner*—Tulsidas C. Patel
*Assistant Examiner*—Harshad C Patel
(74) *Attorney, Agent, or Firm*—Thomas D. Paulius

(57) ABSTRACT

An EMI gasket takes the form of a metal shroud that completely encircles a metal shielding cage. The shroud has an opening that is surrounded by a plurality of sides and each side has first and second flanges, which respectively contact the inner surface of the device faceplate and the exterior surfaces of the shielding cage. A pair of spring arms are provided in order to apply a biasing force against the shroud, thereby forcing it into contact with the faceplate. The spring arms each include a torsion loop, and each loop engages the shielding cage and fixes the rear position of the spring arms.

21 Claims, 6 Drawing Sheets

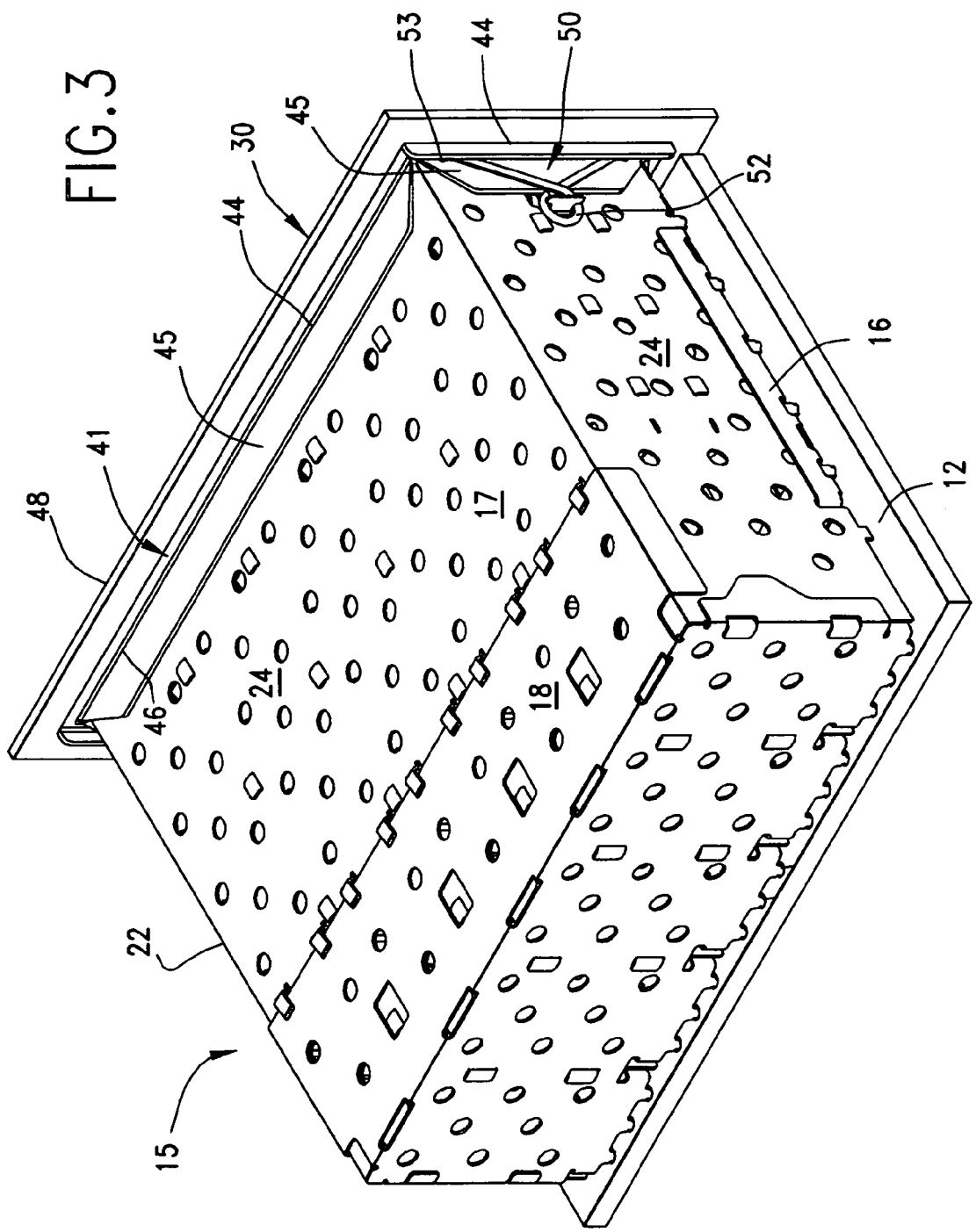

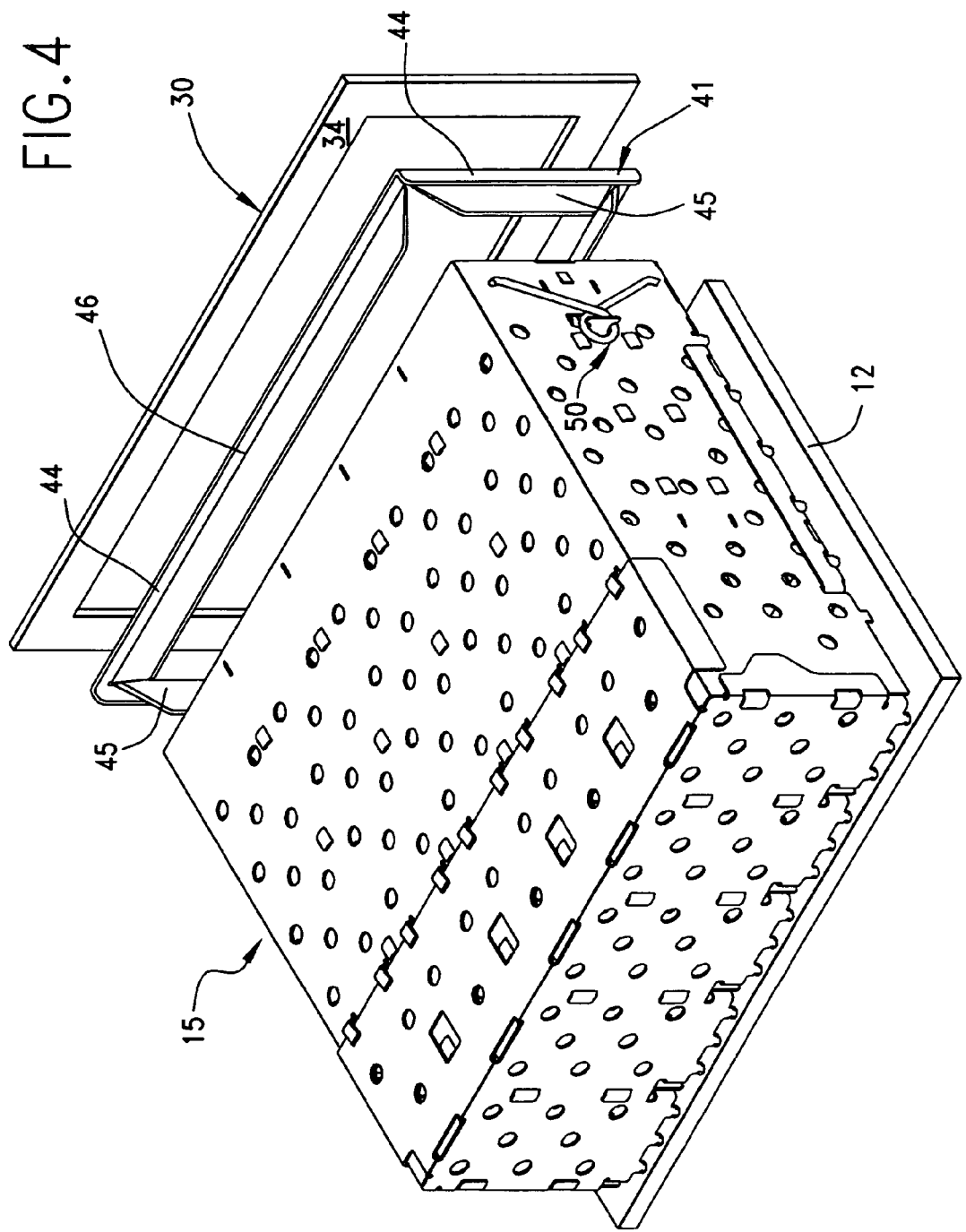

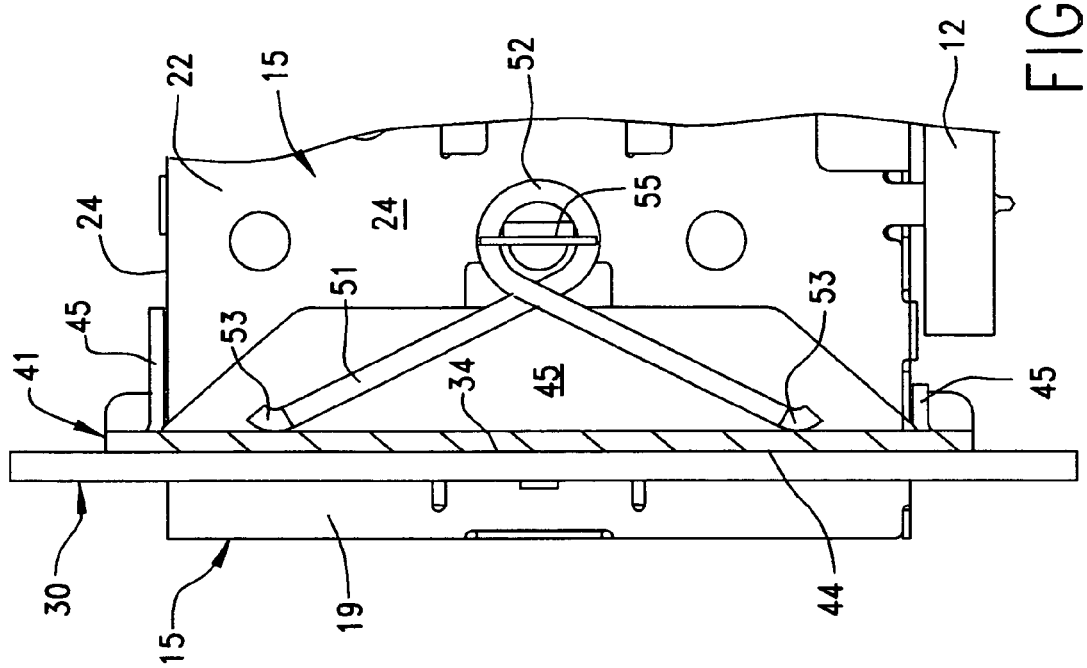
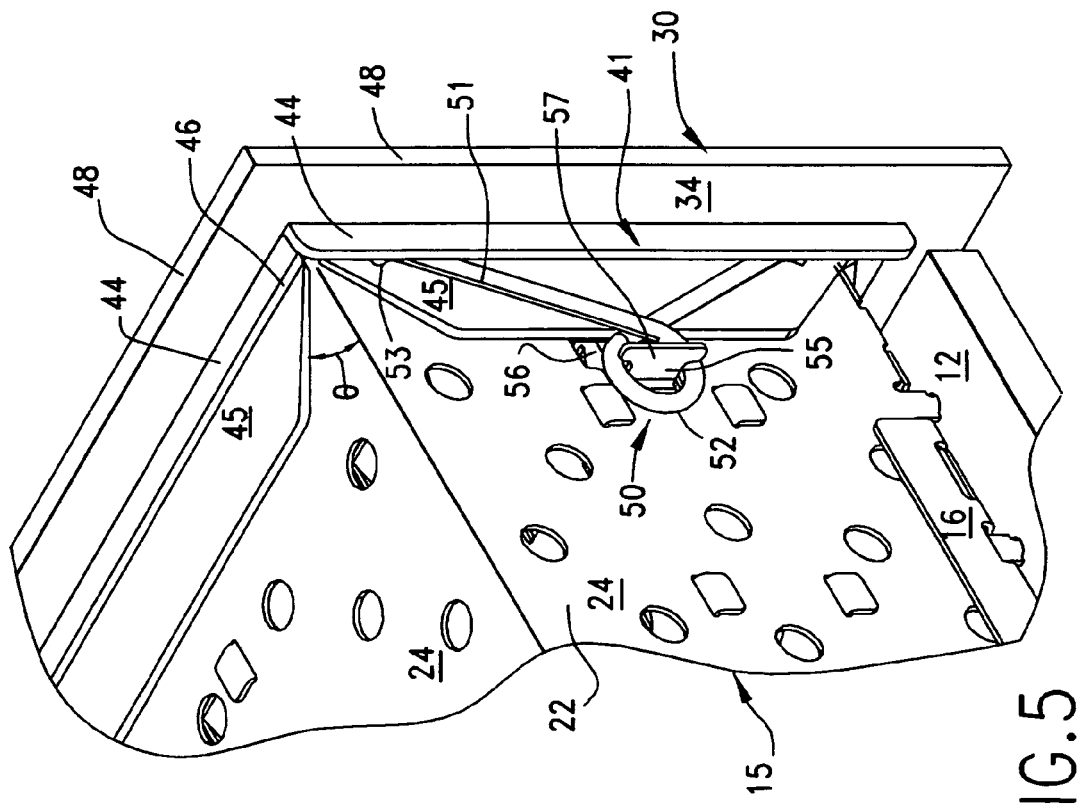

SPRING-BIASED EMI SHROUD

REFERENCE TO RELATED APPLICATIONS

This application claims priority from U.S. Provisional Patent Application Ser. No. 60/742,936 filed Dec. 6, 2005, which is hereby incorporated herein by reference.

BACKGROUND OF THE INVENTION

The present invention relates generally to structures that prevent or retard electromagnetic interference ("EMI") emissions from connector assemblies, and more particularly to an EMI shroud intended for use on a metal shielding cage for blocking electromagnetic interference emissions.

It is a common practice in the electronic arts to connect cables to a circuit board by utilizing plug connectors at the ends of the cables which are intended for insertion into an opposing mating connector. The mating connector is typically mounted on a circuit board, which is held within an exterior housing. Such an arrangement is typically found in servers and routers. These devices have multiple connector assemblies that now operate at high speeds, typically 2 gigabits per second and greater. The high speed electrical transmission in these devices can produce electromagnetic emissions, which may leak from the connection between the plug connector and its mating connector. These emissions can cause problems in high speed transmissions in that they can negatively influence signal transmissions between the connectors.

These types of transmissions are routinely reduced by the use of a metal shielding cage that is also mounted to the circuit board and which surrounds the mating connector in the device. These cages have openings that open to a faceplate, which is commonly referred to as a bezel in the art. These openings define an entrance leading toward the mating connector into which the plug connector is inserted. Testing has determined that despite the metal shielding cages, EMI leakage still occurs in such structure, primarily at the areas where the shielding cages meet the circuit board and around the opening(s) of the faceplate or bezel, into which the cage openings extend. Conductive gaskets have been developed in efforts to address this problem.

Problems still exist in the use of gaskets, for it is desired that the gaskets be conductive and held in close contact to both the shielding cages and the faceplate. These cages are becoming smaller and smaller in size as the overall size of most electronic devices continues to diminish. The small size of the cages often makes it difficult to develop a structure that will force the EMI gasket into reliable contact with the faceplate and the cage, without detrimentally affecting the strength of the shielding cage.

Accordingly, the present invention is directed to an improved EMI gasket structure that takes the form of a shroud and which overcomes disadvantages of the prior art. An important problem to be addressed is how to enhance EMI-preventing contact between components of connector assemblies.

Examples of prior approaches proposed for addressing EMI shielding problems include U.S. Pat. No. 5,204,496 (Boulay, et al.) and U.S. Pat. No. 6,420,009 (Cheng) that show incorporating a bent flange EMI gasket. U.S. Pat. No. 6,851,978 (Akama, et al) proposes a hook for a shielding cage gasket. Included in U.S. Pat. No. 6,752,663 (Bright, et al) is a shielding gasket assembly having pre-formed slots that fit over and receive mounting feet of the bottom of a cage. The combination of a formed gasket and a backing plate is shown in U.S. Pat. No. 6,878,872 (Lloyd, et al.). These patents, and all other references noted herein, are hereby incorporated hereinto by reference.

SUMMARY OF THE INVENTION

Accordingly, it is a general object or aspect of the present invention to provide an EMI gasket structure for use with a shielding cage that utilizes a metal shroud and a biasing mechanism that engages the shielding cage and applies a biasing force to urge the shroud into close contact with a faceplate of the device in which the gasket structure is used.

Another object or aspect of the present invention is to provide an EMI gasket assembly in the form of a metal shroud that encircles the opening of a metal shielding cage, the shroud closely fitting against the cage and an interior surface of a faceplate installed over the cage opening, the assembly including means for biasing the shroud into contact with the faceplate interior surface.

Yet a further object or aspect of an embodiment of the present invention is to provide an EMI shroud for a shielding cage, the shroud having a continuous perimeter with an inner opening that receives the front end of a metal shielding cage therein, the shroud having an inner lip formed thereon that extends along two opposing sides of the shroud, the shroud further having a pair of biasing springs that have a backbone portion with two free ends, the free ends of the biasing springs being received within the shroud inner lips, and the backbone portion of the biasing springs having means for engaging the outer surfaces of the shielding cage.

A still further object or aspect of an embodiment of the present invention is to provide a biased EMI gasket for a metal shielding cage, the shielding cage having a generally rectangular front end that fits into an opening of a faceplate of an electronic device, the gasket including a metal shroud that encircles the cage front end, the shroud having first and second flanges preferably extending along its entire extent, the first flanges contacting an interior surface of said face plate and the second flanges contacting the exterior surfaces of the shielding cage, the shielding cage having a pair of tabs extending outwardly therefrom on two parallel sidewalls of the shielding cage, and a pair of biasing springs disposed along the two sidewalls of the shielding cage, each of the biasing springs including an end loop with two free ends, the end loops engaging the shielding cage tabs, and the spring free ends engaging the shroud between the first and second flanges, the springs imparting an outward biasing force to the shroud against the faceplate of the device.

Yet another object or aspect of an embodiment of the present invention is to provide a shielding cage with a pair of springs disposed on opposite sidewalls of the shielding cage, the springs being disposed such that their end loops engage the shielding cage approximately halfway between the top and bottom walls of the shielding cage.

The present invention accomplishes these and other objects and aspects by virtue of its structure, which in one principal aspect includes a conductive shroud that has a generally rectangular shape, so that it encircles the front end of the shielding cage. Typically, the shroud is stamped and formed from a single piece of conductive material, such as a metal, and it is formed with a central opening so that it extends in a continuous fashion around the entire perimeter of the shielding cage front end.

The shroud may be formed with first and second flanges, and the flanges meet along a perimeter center line such that the junction area of these two flanges contacts the exterior surfaces of the shielding cage. One of the first and second flanges extends forwardly of the shroud toward the shielding cage front end so that it will make contact with an opposing interior surface of a faceplate, or bezel. Along the two sidewalls of the shielding cage, the junction of the first and second flanges defines an interior lip, or shoulder, which defines a reaction surface against which a biasing means rests. The contact between the one flange and the faceplate may be a flush contact between the shroud flange and a rear, or inner, surface of the faceplate and it may also be a flush contact between the one shroud flange and the inner perimeter of the faceplate opening. In any event, the shroud is fitted to fill any opening that occurs between the shielding cage and the faceplate.

In another principal aspect of the present invention, the shroud includes an associated means for biasing the shroud in a forward direction against and into contact with the faceplate interior surface. This biasing means, in an embodiment illustrated herein, takes on the form of a torsion-type spring having two spring arms that are joined together by a center engagement loop. The spring arms have free ends that extend forwardly and into contact with the interior lip of the shroud. In order to provide a means for fixing the biasing means to the shielding cage, one or more engagement tabs may be formed as part of the shielding cage itself, and these tabs extend outwardly from the shielding cage exterior surfaces, preferably in directions transverse to the direction of insertion of a plug connector into the shielding cage.

The center loops of the spring in this embodiment engage these tabs, and the tabs serve to fix the location of the spring relative to the shroud and the shielding cage front end. As such, these tabs define fixed points of engagement. In assembly, the shroud is placed over the shielding cage front end so that its first flange faces up and extends toward the shielding cage front end. The spring loops are placed onto their respective engagement tabs, and the free ends are placed into the interior lips of the shroud. The tabs may have a mushroom-type configuration with an enlarged end so as to retain the biasing spring in place thereon. The lower portion of the shroud may be slotted so as to provide mounting clearance with the mounting legs of the shielding cage.

These and other objects, aspects, features and advantages of the present invention will be clearly understood through a consideration of the following detailed description.

BRIEF DESCRIPTION OF THE DRAWINGS

The invention, together with its objects and the advantage thereof, may be best understood by reference to the following description taken in conjunction with the accompanying drawings, in which like reference numerals identify like elements in the figures and in which:

FIG. 3 is the same view as FIG. 1, but taken from the rear of the assembly;

FIG. 4 is the same view as FIG. 3, but illustrated in an exploded fashion;

FIG. 5 is an enlarged view of an embodiment of the biasing means used in association with the EMI shroud of the invention;

FIG. 6 is an enlarged side view of FIG. 1, partially in section and cut away, of the interface between the EMI shroud, the top of the shielding cage and the faceplate; and, FIG. 7 is an enlarged detail view, taken from the top of the shielding cage in order to show the interface between the shroud and the faceplate in this illustrated embodiment.

DETAILED DESCRIPTION OF THE PREFERRED EMBODIMENTS

Figure 1:
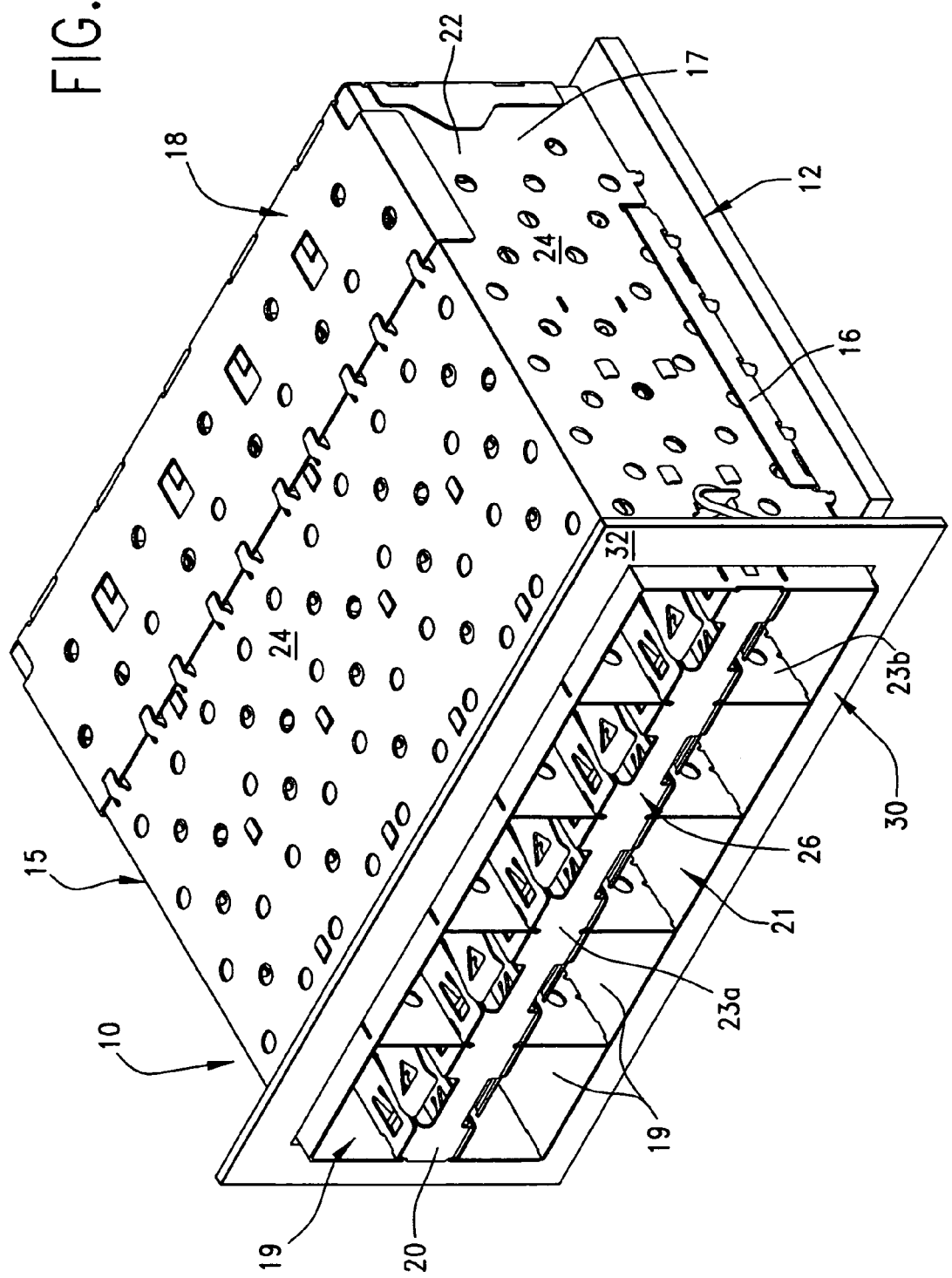
FIG. 1 is a perspective view of an electronics assembly that utilizes a shielding cage, internal connector mounted to a circuit board and having a faceplate extending around the shielding cage.

FIG. 1 illustrates an electronic assembly 10 of the type that would normally be found in a router or server and which is utilized in the transmission of high speed data signals. Such an assembly includes a plurality of receptacle-style connectors (not shown) that are mounted in a stacked configuration, to a circuit board 12. A metal shielding cage 15 is provided and as, shown the cage 15 includes a base plate, or bottom wall 16, a body portion 17 (which includes a pair of sidewalls 22) and a rear and top plate, or wall, 18 that engages the cage and covers its rear end and part of its top. The cage 15 has a series of openings 19 that lead to respective hollow interior bays, into each of which an electronic module (also not shown) attached to a cable end, may be inserted. Once assembled, the shielding cage 15 has a plurality of exterior surfaces 24. The metal shielding cage 15 is conductive and the front end of it usually is inserted into a faceplate of an electronic device. Specifically, the front end 21 of the shielding cage assembly is received within an opening 31 (FIG. 2) of the faceplate 30.

FIG. 1 shows the assembly as including a shielding cage 15 of the 2×5 style, that is two horizontal rows with five cage openings 19 each extending in a horizontal fashion. The openings 19 are stacked one on top of each another and in order to accommodate this arrangement, the shielding cage 15 illustrated includes interior, or center, wall portion 20 which separates the two bays or openings from each other. Electronic modules, which are connected to wire cables, are inserted into and removed from the cage openings in order to make a connection to the receptacle connectors held in the interior of the shielding cage 15. The shielding cage 15 has a front end 21 that contains the plurality of openings 19.

The shielding cage 15 and its internal connectors and supporting circuit board are held together in a exterior enclosure (not shown) but which includes a faceplate, or bezel 30. This faceplate 30 sits over the front opening of the exterior enclosure and around the perimeter of the shielding cage as shown. In this regard, the faceplate 30 is typically a continuous member, formed from sheet metal with a desired thickness, and an inner opening 31. A lip 33 defines the inner surface of the faceplate opening, and the faceplate has a front, or outer, surface 32 and a rear, or inner, surface 34. The front end 21 of the shielding cage projects slightly past the outer surface 31 of the faceplate 30. The fit between the shielding cage 15 and the faceplate lip 33 is preferably an interference fit, with the faceplate loose enough to be slid over the cage front end 21.

The area between the faceplate and the shielding cage is prone to the discharge, or leakage, of electromagnetic emissions during high speed data transfer that can cause EMI. Accordingly, designers in the electronic arts endeavor to provide some sort of gasket that fits between the shielding cage and the faceplate 15. Achieving uniform and secure contact that addresses leaking of electromagnetic emissions is problematic. The present invention is directed to problems that arise in the use of such EMI gaskets and difficulties in holding the gasket in uniform and secure contact between the cage and the faceplate. Conductive pliable foams have been used, but they are prone to tearing and other damage, and the degree of EMI protection may be dependent on the amount of conductive material. The foam materials tend to deform over time, and this deformation may weaken the ability of the foam to stay in uniform and secure contact with the shielding cage and the faceplate.

Figure 2:
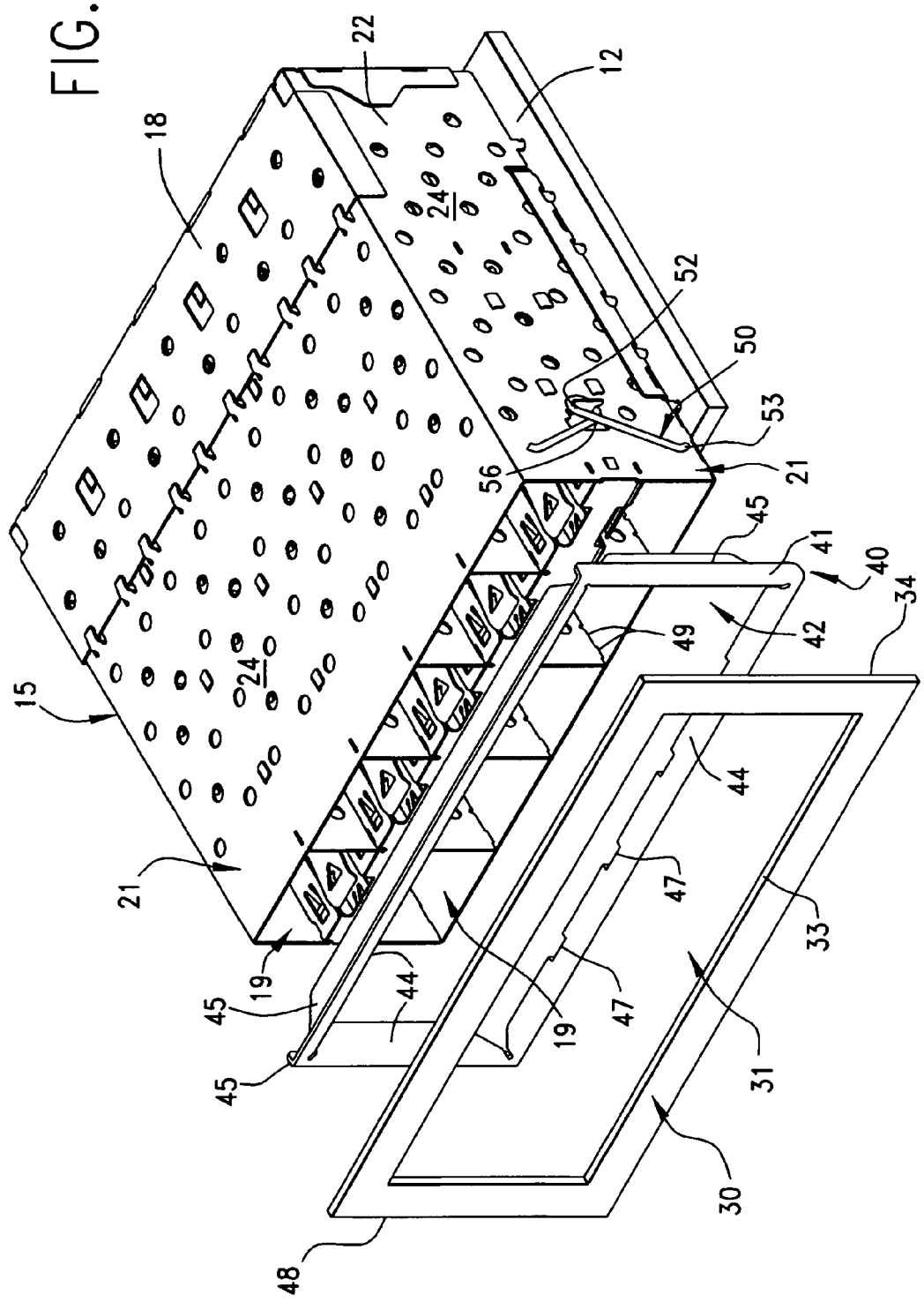
FIG. 2 is the same view as FIG. 1, but illustrated in an exploded fashion.
Figure 7:
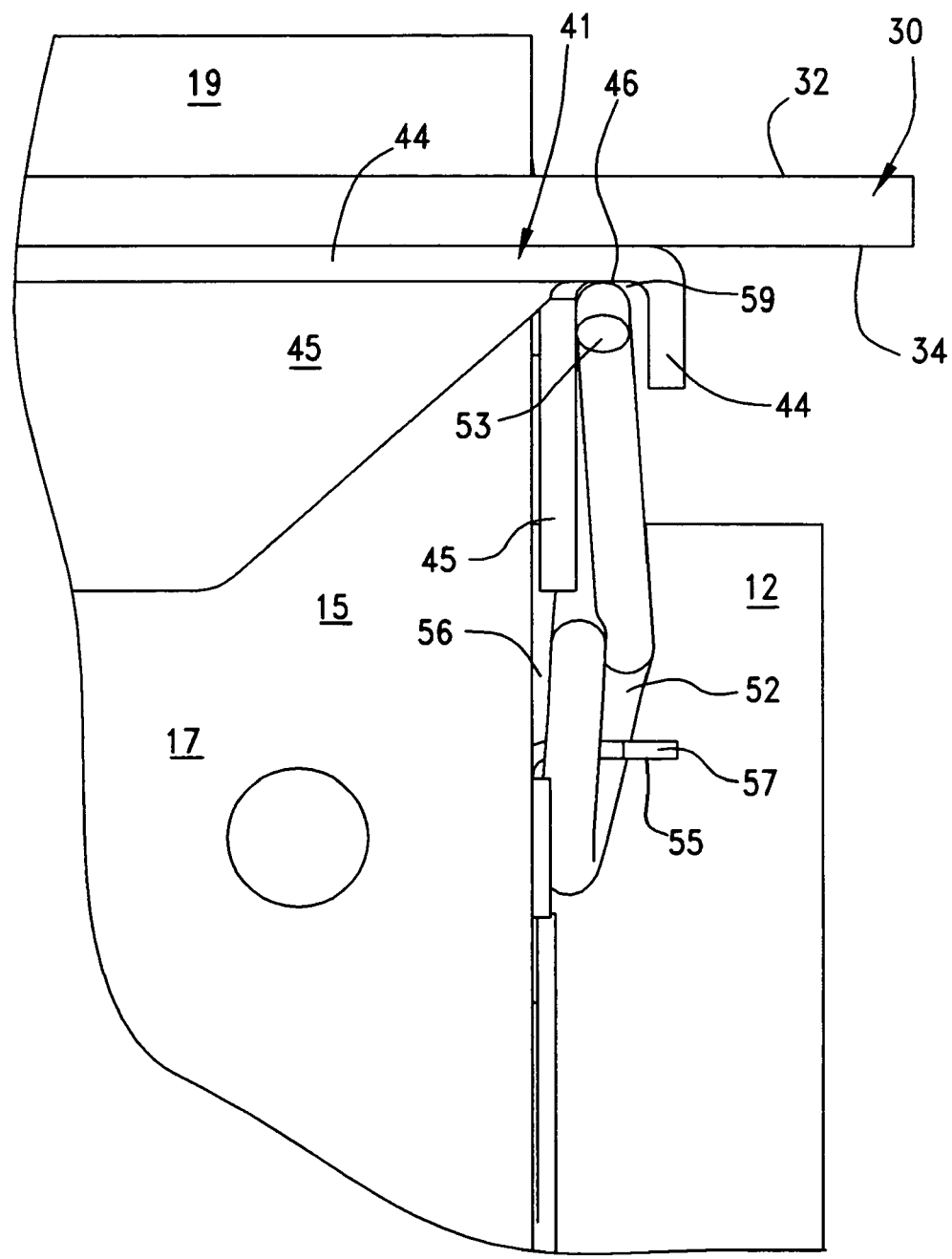

The present invention utilizes an improved gasket construction. As shown in FIG. 2, a conductive gasket 40 is provided in the form of a metal shroud 41. The shroud 41 includes a plurality of sides, which are preferably interconnected together to form a continuous structure. The shroud 41 has an opening 42 formed therein that is sized and shaped to receive the front end 21 of the shielding cage therein. The shroud 41, in the embodiment shown, is stamped out of sheet metal, and each side, or leg, thereof can be seen to be bent into a general U- or V-shape, in which first and second flanges 44, 45 are defined on opposite sides of a fold, or form, line 46 (FIGS. 4 and 7.) As shown, the flanges are bent on opposite sides of the form line 46. Preferably, each side of the shroud 41 includes both of the two flanges, and more preferably, as shown best in FIG. 3, the second flange 45 is placed into contact with the exterior surfaces of the shielding cage, and the first flange 44 is either placed into contact with the interior surface 34 of the faceplate, or into contact with inner lip 33 of the faceplate. Preferably, the contact is a flush contact so that the shroud 41 fills and seals the space between the faceplate opening and the exterior of the shielding cage 15.

FIG. 5 illustrates best the manner in which the shroud provides an EMI seal to the structure of this illustrated embodiment. The shroud 41 contacts the exterior surfaces 24 of the shielding cage 15. This contact is primarily effected by the form line 46 of the shroud 41 and secondarily by the second flange 45 of the shroud. The flange 45 preferably contacts the shielding cage 15 for a preselected distance from the form line 46 rearwardly toward the end of the shielding cage 15, such that the second flange 45 extends upwardly from the shielding cage exterior surfaces 24 at an slight (acute) angle as illustrated at 2 in FIG. 5. The second flange 45 may also lie flush against the exterior surfaces 24 of the shielding cage 15.

Likewise, the first flanges 44 contact the inner surface 34 of the faceplate 30 for a short extent and extend at an angle outwardly therefrom either toward the ends 48 of the faceplate 30 or toward the rear of the cage as illustrated in FIGS. 5 and 6. As such the first flange 44 of the shroud 41 may lie partially flush against the inner surface of the faceplate 30 and extend away at an angle therefrom as the second flange 45 does with the shielding cage 15, or as in the embodiment illustrated, the first flange 44 of the shroud 41 contacts the inner lip 33 of the faceplate 30.

In any event, it is desirable that the EMI shroud 41 makes contact with the shielding cage at a minimum along its form line 46 in order to provide a base point of contact with the shielding cage 15, so that the shroud and its flanges 44, 45 fill any opening that occurs between the shielding cage and the faceplate opening inner lip 33. Thus the shroud serves as an EMI barrier that seals the faceplate opening 31. As shown in FIG. 2, the bottom portion of the shroud 41 may be notched, as at 47, and these notches 47 are aligned with the forward attachment legs 49 that extend through slots formed in the base plate 16 of the shielding cage 15.

In order to exert a pressure on the shroud and to keep it in contact with the faceplate 30, a biasing means is provided. In the illustrated embodiment shown in the Figures a biasing means 50 is shown as a pair of biasing springs 51 that are formed to define a torsion, or coil, loop 52 at one end thereof and a pair of free ends 53 at the other end thereof. In the embodiment illustrated, the torsion loops 52 constitute the rear ends of the biasing springs 51, and they form what we consider to be backbone portions of the biasing springs 51 while the free ends 53 define the front ends of the biasing springs 51. The free ends 53 are captured between the two flanges 44, 45, along the sidewalls of the shielding cage 15, and they preferably make contact with the form line 46 of the shroud 41. In this fashion, the form line 46 may be considered as forming along an inner lip 59 (FIG. 7) of the shroud 41. The free ends 53 of the illustrated biasing springs 51 are retained between the flanges 44, 45 and make contact with the shroud inner lip 59 so as to provide a forward biasing force against the shroud 41 to urge it into contact with the faceplate 30, particularly the inner surface 34 thereof.

The shielding cage 15 may be provided with engagement members, illustrated in the form of tabs 55 that extend outwardly away from the sidewalls of the cage 21. These tabs 55 are received within the openings of the torsion loops 52 of the biasing springs 51 and so define a fixed reaction, or anchor point, for the biasing springs 51 while attached to the shielding cage 15. In the illustrated embodiment, the tabs 55 may be formed as part of the shielding cage interior walls 23a, 23b (FIG. 1) and project through corresponding openings 56 that are formed in the shielding cage sidewalls 22. The tabs 55 may have an enlarged head portion 57 that prevents the torsion loop 52 from coming out of its engagement with the tab 55. The illustrated embodiment shows this head portion as a mushroom-style shape. The springs 51 may be easily applied by squeezing the free ends of the spring to enlarge the torsion loop and slip it over the enlarged head portions 57 of the engagement tabs 55.

The horizontal interior walls 23a shown in the Figures may be easily formed by bending a sheet of sheet metal over upon itself to create a central area 26 between the top and bottom bays and openings 19 of the shielding cage 15 which spaces the bays apart from each other and defines a plurality of openings 19 in the shielding cage 15. In order to attempt to achieve an even pressure on the shroud against the faceplate 30, the engagement tabs 55 are preferably located along a line that is aligned with this central area, which lies approximately midway between the top and bottom surfaces of the shielding cage sidewalls 22. Although described as being made from metal, the shroud 41 may be formed from other materials, such as a plastic, which has either been conductively coated with a metal or which has had conductive material integrated into it such as by molding or filling.

FIGS. 6 and 7 illustrate the contact that occurs between the shielding cage exterior surfaces 24 and the shroud flanges 44, 45. As shown in FIG. 6, the second flanges 45 extend generally parallel, or flush with the exterior surfaces 24 of the shielding cage 15, with the understanding that as used herein "flush" means that the inner surfaces of the flanges 45 are as close as they can be to the exterior surfaces of the shielding cage yet still permit some movement of the shroud on the shielding cage. FIG. 7 illustrates one manner in which the first flange 44 contacts the faceplate 30 and forms the inner lip 59 against which the free ends of the torsion springs 51 bear.

While the preferred embodiment of the invention have been shown and described, it will be apparent to those skilled in the art that changes and modifications may be made therein without departing from the spirit of the invention, the scope of which is defined by the appended claims, including those combinations of features that are individually disclosed of claimed herein.

The invention claimed is:

1. A shielding cage assembly for housing a connector mounted to a circuit board in an electronic device, the assembly comprising:
   a metal shielding cage having at least top and bottom walls and a pair of spaced apart sidewalls that cooperate with the top and bottom walls to define an enclosure for housing the connector, the shielding cage including a front end with at least one opening disposed thereat which leads to an interior portion of said shielding cage, the front end being received within an opening of a faceplate of the electronic device;
   an EMI gasket for reducing EMI emissions between said shielding cage and said faceplate opening, the gasket including a metal shroud with a body portion that fits around said shielding cage front end, the body portion including a central opening that receives said shielding cage front end therein, said shroud including first and second flanges, the first flange contacting an interior surface of said faceplate and said second flange contacting said shielding cage when said shielding cage assembly is inserted into said electronic device; and,
   means for biasing said shroud against the faceplate interior surface such that at least said first flange of said shroud contacts the faceplate interior surface, the biasing means including at least one biasing spring, the biasing spring having a backbone portion and at least one free end, the backbone portion engaging said shielding cage and the one free end engaging said shroud.

2. The shielding cage assembly of claim 1, wherein said biasing spring includes two free ends, the biasing spring two free ends engaging said shroud.

3. The shielding cage assembly of claim 2, wherein said first and second flanges of said shroud are joined together and cooperatively define an inner lip of said shroud, said biasing spring free ends engaging the shroud inner lip.

4. The shielding cage assembly of claim 2, wherein said biasing spring backbone portion includes a torsion spring with a loop disposed intermediate said two free ends, and said shielding cage includes a tab disposed thereon which engages the loop.

5. The shielding cage assembly of claim 1, wherein said shroud is a continuous member.

6. The shielding cage assembly of claim 5, wherein said shroud first and second flanges meet together to define an inner lip on two opposing ends of said shroud, the shroud ends fitting over said shielding cage sidewalls, and said biasing means includes a pair of biasing springs, each of the biasing springs including a torsion loop disposed at one end thereof and further including a pair of free ends disposed at another end thereof, the biasing spring torsion loops engaging said shielding cage along said sidewalls thereof and the biasing spring free ends engaging said shroud inner lip.

7. The shielding cage assembly of claim 6, wherein said shielding cage sidewalls include a pair of tabs extending outwardly therefrom, said biasing spring torsion loops engaging the tabs, and said tabs including enlarged end portions for retaining said torsion loops in place thereon.

8. The shielding cage assembly of claim 7, wherein said shielding cage includes at least one vertical and at least one horizontal interior wall, the horizontal and vertical walls intersecting to divide said shielding cage opening into at least two distinct sub-openings, the shielding cage sidewall tabs being aligned with said horizontal interior wall.

9. The shielding cage assembly of claim 6, wherein said biasing spring torsion loops engage said shielding cage sidewalls at respective approximate midpoints between said top and bottom walls thereof.

10. A shielding cage assembly for housing a connector mounted to a circuit board in an electronic device, the assembly comprising:
    a metal shielding cage having at least top and bottom walls and a pair of spaced apart sidewalls that cooperate with the top and bottom walls to define an enclosure for housing the connector, the shielding cage including a front end with at least one opening disposed thereat which leads to an interior portion of said shielding cage, the front end being received within an opening of a faceplate of the electronic device;
    an EMI gasket for reducing EMI emissions between said shielding cage and said faceplate opening, the gasket including a metal shroud with a body portion that fits around said shielding cage front end, the body portion including a central opening that receives said shielding cage front end therein, said shroud including first and second flanges, the first flange contacting an interior surface of said faceplate and said second flange contacting said shielding cage when said shielding cage assembly is inserted into said electronic device; and,
    at least one biasing member having one end portion engaging said shielding cage and another end portion engaging at least one of said flanges of the shroud, and said biasing member urges said shroud against the faceplate interior surface, said biasing member including a biasing spring having a backbone portion and at least one free end, the backbone portion engaging said shielding cage and the at least one free end engaging said shroud flange.

11. The shielding cage assembly of claim 10, biasing spring includes two free ends, each of the two free ends engaging said shroud flange.

12. The shielding cage assembly of claim 10, wherein said first and second flanges of said shroud are joined together and cooperatively define an inner lip of said shroud, the biasing member engaging said shroud inner lip.

13. The shielding cage assembly of claim 11, wherein said biasing spring backbone portion includes a torsion spring with a loop disposed intermediate said two free ends, and said shielding cage includes a tab disposed thereon which engages the loop.

14. The shielding cage assembly of claim 10, wherein said shroud is a continuous member.

15. The shielding cage assembly of claim 14, wherein said shroud first and second flanges meet together to define an inner lip on two opposing ends of said shroud, the shroud ends fitting over said shielding cage sidewalls, and said biasing member is a biasing spring, a pair of said biasing springs being included, each of the biasing springs including a torsion loop disposed at one end thereof and further including a pair of free ends disposed at another end thereof, the biasing spring torsion loops engaging said shielding cage along said sidewalls thereof and the biasing spring free ends engaging said shroud inner lip.

16. The shielding cage assembly of claim 15, wherein said shielding cage sidewalls include a pair of tabs extending outwardly therefrom, said biasing spring torsion loops engaging the tabs, and said tabs including enlarged end portions for retaining said torsion loops in place thereon.

17. The shielding cage assembly of claim 16, wherein said shielding cage includes at least one vertical and at least one horizontal interior wall, the horizontal and vertical walls intersecting to divide said shielding cage opening into at least two distinct sub-openings, the shielding cage sidewall tabs being aligned with said horizontal interior wall.

18. The shielding cage assembly of claim 15, wherein said biasing spring torsion loops engage said shielding cage sidewalls at respective approximate midpoints between said top and bottom walls thereof.

19. An EMI gasket assembly for a shielding cage, the gasket assembly comprising:
- a metal shroud, the shroud having a plurality of sides interconnected to each other and an opening disposed therein, the opening being sized and shaped to receive a shielding cage therein, each of the sides having a first flange and a second flange, the first flange extending away from a shielding cage, the second flange contacting an exterior surface of a shielding cage when said shroud is positioned over the shielding cage; and,
- a pair of biasing springs adapted for securing said shroud to a shielding cage, each of the biasing springs having a torsion coil at one end and two free ends at an opposite end, the biasing spring free ends extending toward said shroud and contacting said shroud when a shielding cage is inserted into said shroud opening.

20. The EMI gasket assembly of claim 19, wherein said shroud includes an inner lip portion where said first and second flanges meet.

21. The EMI gasket assembly of claim 20, wherein said biasing spring free ends contact said inner lip of the shroud.

* * * * *